United States Patent
Gabara et al.

(10) Patent No.: US 7,353,450 B2
(45) Date of Patent: Apr. 1, 2008

(54) BLOCK PROCESSING IN A MAXIMUM A POSTERIORI PROCESSOR FOR REDUCED POWER CONSUMPTION

(75) Inventors: Thaddeus J. Gabara, Murray Hill, NJ (US); Inkyu Lee, Kearny, NJ (US); Marissa L. Lopez-Vallejo, Madrid (ES); Syed Mujtaba, Berkeley Heights, NJ (US)

(73) Assignee: Agere Systems, Inc., Allentown, PA (US)

( * ) Notice: Subject to any disclaimer, the term of this patent is extended or adjusted under 35 U.S.C. 154(b) by 1160 days.

(21) Appl. No.: 10/054,687

(22) Filed: Jan. 22, 2002

(65) Prior Publication Data

US 2003/0139927 A1 Jul. 24, 2003

(51) Int. Cl.
*H03M 13/03* (2006.01)

(52) U.S. Cl. .................... 714/794; 375/265; 714/792

(58) Field of Classification Search ............... 375/265, 375/340, 341; 714/755, 769, 780, 786, 792–794
See application file for complete search history.

(56) References Cited

U.S. PATENT DOCUMENTS

| | | | | |
|---|---|---|---|---|
| 5,600,664 A | * | 2/1997 | Hayashi | 714/794 |
| 5,768,285 A | * | 6/1998 | Griep et al. | 714/704 |
| 5,933,462 A | * | 8/1999 | Viterbi et al. | 375/341 |
| 6,192,501 B1 | * | 2/2001 | Hladik et al. | 714/786 |
| 6,658,071 B1 | * | 12/2003 | Cheng | 375/348 |
| 6,807,238 B1 | * | 10/2004 | Rhee et al. | 375/340 |
| 2001/0021233 A1 | * | 9/2001 | Jin | 375/341 |
| 2002/0029362 A1 | * | 3/2002 | Stephen et al. | 714/752 |
| 2003/0074628 A1 | * | 4/2003 | Lee | 714/794 |
| 2003/0101402 A1 | * | 5/2003 | Amrani et al. | 714/755 |

* cited by examiner

*Primary Examiner*—Chieh M. Fan
*Assistant Examiner*—Freshteh N Aghdam
(74) *Attorney, Agent, or Firm*—Steve Mendelsohn; Kevin M. Drucker

(57) ABSTRACT

A maximum a posteriori (MAP) processor employs a block processing technique for the MAP algorithm to provide a parallel architecture that allows for multiple word memory read/write processing and voltage scaling of a given circuit implementation. The block processing technique forms a merged trellis with states having modified branch inputs to provide the parallel structure. When block processing occurs, the trellis may be modified to show transitions from the oldest state at time k–N to the present state at time k. For the merged trellis, the number of states remains the same, but each state receives $2^N$ input transitions instead of the two input transitions. Branch metrics associated with the transitions in the merged trellis are cumulative, and are employed for the update process of forward and backward probabilities by the MAP algorithm. During the update process, the read/write operation for an implementation transfers N words of length N for each update operation, but the frequency (and hence, number) of update operations is reduced by a factor of N. Such voltage scaling and multiple word memory read/write may provide reduced power consumption for a given implementation of MAP processor in, for example, a DSP.

13 Claims, 3 Drawing Sheets

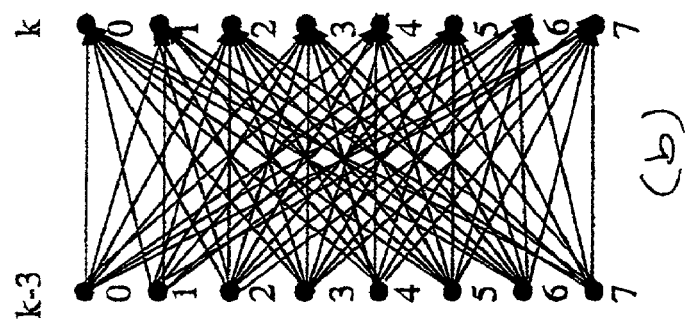
FIG. 2
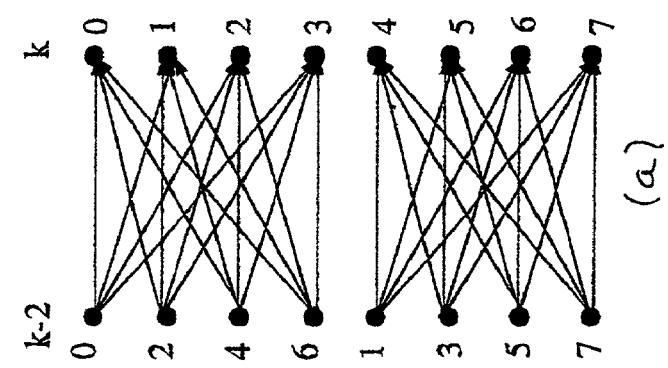
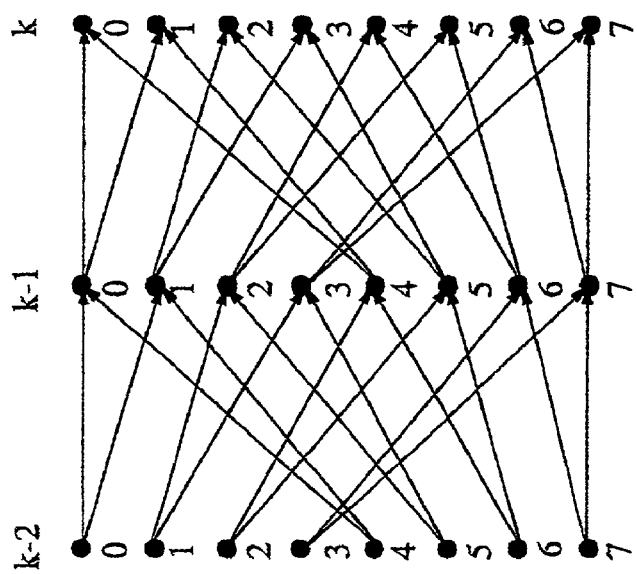
FIG. 1
(PRIOR ART)

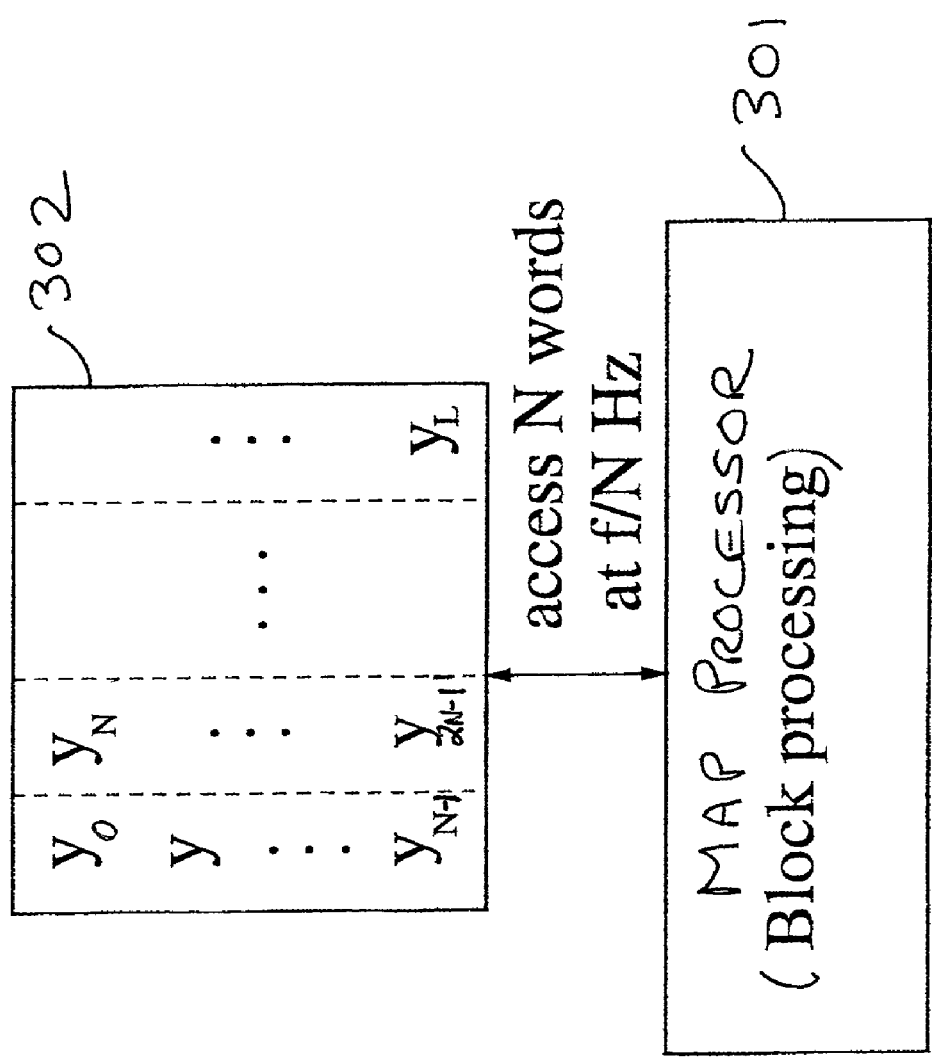

BLOCK PROCESSING IN A MAXIMUM A POSTERIORI PROCESSOR FOR REDUCED POWER CONSUMPTION

BACKGROUND OF THE INVENTION

1. Field of the Invention

The present invention relates to block processing encoded data with a maximum a posteriori (MAP) algorithm by a receiver in a telecommunications system.

2. Description of the Related Art

MAP decoding algorithms are employed for processing data input to a processor for detection and/or decoding operations. The algorithm provides a maximum a posteriori estimate of a state sequence of a finite-state, discrete-time Markov process. The MAP algorithm forms a trellis corresponding to possible states (determined by a portion of received symbol bits in the sequence) for each received channel output value per unit increment in time (i.e., clock cycle).

States, and transitions between states, of the Markov process spanning an interval of time may be represented by a trellis diagram. The number of bits that a state represents is equivalent to the memory of the Markov process. Thus, probabilities (sometimes of the form of log-likelihood values) are associated with each transition within the trellis, and probabilities are also associated with each decision for a symbol bit in the sequence.

The processor using the MAP algorithm computes log-likelihood values using $\alpha$ values (forward state probabilities for states in the trellis), and then $\beta$ values (backward state probabilities in the trellis) after the $\alpha$ values are computed, as described subsequently. The $\alpha$ values are associated with states within the trellis, and these $\alpha$ values are stored in memory. The processor using the MAP algorithm computes values of $\beta$, and the $\alpha$ values are then retrieved from memory to compute the final output log-likelihood values. To compute the log-likelihood values, the entire state metric array of $\alpha$ values is stored by the MAP algorithm.

The variable $S_k$ is defined as the set of states of the Markov process at time k, and $y_k$ is defined as the noisy channel output sample at time k, the sample sequence of length K=L+1 is defined as the sequence $y^K=(y_0, y_1, \ldots, y_k, \ldots, y_L)$ and, for a data block of length K, probability functions may be defined for the Markov process as given in equations (1) through (3):

$$\alpha_s^k = p(S_k=s; y_k^s) \quad (1)$$

$$\beta_s^k = p(y_{k+1}^K|S_k=s) \quad (2)$$

$$\gamma_{s',s}^k = p(S_k=s; y_k|S_{k-1}=s'). \quad (3)$$

where s defines the state $S_k$ of the Markov process at time k and s' defines the state $S_{k-1}$ of the Markov process at time k-1.

The log-likelihood value $L(u_k)$ for a user's symbol $u_k$ at time k may then be calculated as given in equation (4):

$$L(u_k) = \log\left(\frac{p(u_k=+1|y_k^K)}{p(u_k=-1|y_k^K)}\right). \quad (4)$$

FIG. 1 shows an 8 state trellis from time k-2 to time k. In the figures, the number next to the state indicates the state number i.

Defining $\alpha_i^k$ and $\beta_i^k$ from equations (1) and (2) as the forward and backward probabilities (state metrics) at time k in state i, respectively, and defining $\gamma_{i,j}^k$ as the branch metric associated with the transition from state i at time k-1 to state j at time k, then, the forward recursion for states is given in equation (5):

$$\alpha_j^k = \sum_{i \in S} \alpha_i^{k-1} \gamma_{i,j}^k, \text{ for } j = 0, 1, \ldots, M-1. \quad (5)$$

where i∈S is a set of states at time k-1 which have a valid transition to the state j at time k, and M is the number of states.

Similarly, the backward recursion for states is given in equation (6):

$$\beta_i^{k-1} = \sum_{j \in S} \beta_j^k \gamma_{i,j}^k, \text{ for } i = 0, 1, \ldots, M-1. \quad (6)$$

where j∈S is a set of states at time k which have a valid transition from the state i at time k-1.

Once the forward and backward recursions for states are calculated, from equation (4), the log-likelihood value (also known as reliability value) $L(u_k)$ for each user symbol $u_k$ is generated as given in equation (7):

$$L(u_k) = \log\left(\frac{\sum_{(i,j) \in S^+} \alpha_i^{k-1} \gamma_{i,j}^l \beta_j^k}{\sum_{(i,j) \in S^-} \alpha_i^{k-1} \gamma_{i,j}^k \beta_j^k}\right) \quad (7)$$

where a state pair $(i, j) \in S^+$ is defined as a pair that has a transition from state i at time k-1 to state j at time k corresponding to the user symbol $u_k$="1", and a state pair (i, j)∈$S^-$ is similarly defined as a pair that has a transition from state i at time k-1 to state j at time k corresponding to the user symbol $u_k$="-1".

The Log MAP algorithm may be defined by substituting $A_j^k=\ln(\alpha_j^k)$, $B_j^k=\ln(\beta_j^k)$ and $\Gamma_{i,j}^k=\ln(\gamma_{i,j}^k)$ into the equations (5), (6), and (7). Also, with the relation that ln(exp x+exp y) is equivalent to max(x,y)+ln(exp(-|x-y|)+1), the Log MAP algorithm may be described as in equations (8) and (9):

$$A_j^k = \max_{i \in S} {}^*(\alpha_i^{k-1} + \Gamma_{i,j}^k) \quad (8)$$

$$B_i^{k-1} = \max_{j \in S} {}^*(B_j^{k-1} + \Gamma_{i,j}^k) \quad (9)$$

where max*(x, y) is defined as max(x, y)+ln(exp(-|x-y|)+1).

As an example, for the forward recursion, $A_2^k$ in state 2 at time k as shown in FIG. 1 is computed as in equation (10):

$$A_2^k = \max{}^*(A_1^{k-1}+\Gamma_{1,2}^k, A_5^{k-1}+\Gamma_{5,2}^k). \quad (10)$$

When implemented, a MAP algorithm updates the state metrics to compute $\alpha_i^k$ and $\beta_i^{k-1}$ (or their log values for the Log MAP algorithm) based on 1) the current values for the state metrics $\alpha_i^{k-1}$ and $\beta_i^k$ for all i (all states in the set S) and 2) the current sample $y_k$. The update occurs for each time k=0, 1, 2, ..., L, and each update for time k performs a calculation using only the sample corresponding to time k. Thus, the read/write operation for an implementation transfers a single sample word for each update operation at a given rate f.

SUMMARY OF THE INVENTION

In accordance with embodiments of the present invention, a maximum a posteriori (MAP) processor employs a block processing technique for the MAP algorithm to provide a parallel architecture that allows for multiple word memory read/write processing. The block processing technique forms a merged trellis with states having combined branch inputs to provide the parallel structure. When block processing occurs, the trellis may be modified to show transitions from the oldest state at time k–N to the present state at time k. For the merged trellis, the number of states remains the same, but each state receives $2^N$ input transitions instead of two input transitions in the original trellis. Branch metrics associated with the transitions in the merged trellis are combinations of branch metrics of the original trellis, and are employed for the update process of forward and backward probabilities by the MAP algorithm. During the update process, the read/write operation for an implementation transfers words of length N for each update operation, but the frequency (and hence, number) of update operations is reduced by a factor of N. Such multiple word memory read/write may provide reduced power consumption for a given implementation of a MAP processor in, for example, a DSP.

In accordance with an exemplary embodiment of the present invention, probabilities are generated to calculate log-likelihood values in a maximum a posteriori (MAP) processor for samples corresponding to data. A first block of samples and a corresponding set of forward probabilities are retrieved, wherein the block of samples correspond to states of a merged trellis, wherein the merged trellis provides combined probabilities of transition from one or more states at k–N, N an integer greater than 1, to current states at time k as the set of forward probabilities. The set of forward probabilities of the merged trellis for the current state at time k are updated based on the block of samples and the corresponding set of forward probabilities.

BRIEF DESCRIPTION OF THE DRAWINGS

Other aspects, features, and advantages of the present invention will become more fully apparent from the following detailed description, the appended claims, and the accompanying drawings in which:

FIG. 1 shows a prior art trellis diagram for a maximum a posteriori (MAP) processor;

FIGS. 2(a) and 2(b) show modified trellises in accordance with an exemplary embodiment of the present invention for block processing where transitions for two and three sets of previous states and their associated branch metrics are merged;

FIG. 3 shows an exemplary implementation of memory and memory access for a MAP processor operating in accordance with an exemplary embodiment of the present invention.

DETAILED DESCRIPTION

Figure 4:
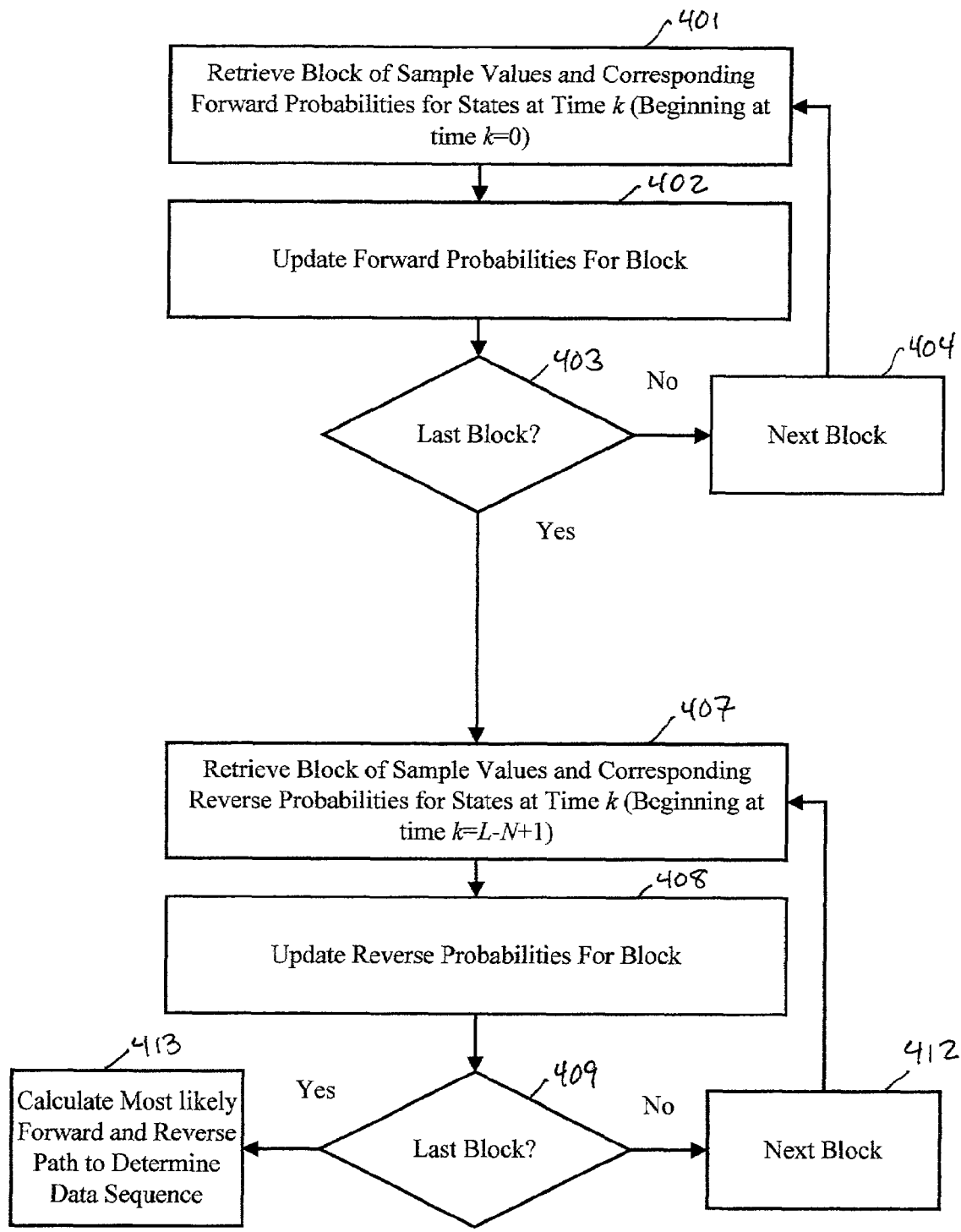
FIG. 4 shows an exemplary method of MAP detection including updating forward and backward probabilities in accordance with an exemplary embodiment of the present invention.

In accordance with embodiments of the present invention, a maximum a posteriori (MAP) processor employs a block processing technique for the MAP algorithm to provide a parallel architecture that allows for multiple word memory read/write processing of a given circuit implementation. The block processing technique forms a merged trellis with states having modified branch inputs to provide the parallel structure. Such multiple word memory read/write may provide reduced power consumption for a given implementation of MAP processor in, for example, a DSP.

By combining multiple intermediate time states of a trellis to form a merged trellis from time k–N to time k, the merged trellis structure exhibits a parallel structure. When block processing occurs, more than one (i.e., N>1) received sample may be accounted for at a state in the trellis, and the trellis may be modified to show transitions from the oldest state (at time k–N) to the present state (at time k). During block processing, the state branch and path metrics associated with transitions account for each transition between receive samples. For example, FIG. 2(a) shows a modified trellis for block processing with N=2, and FIG. 2(b) shows a modified trellis for block processing with N=3. For these new merged trellises, the number of states remains the same, but each state takes $2^N$ input transitions instead of the two input transitions.

Preferred embodiments of the present invention employ the Log MAP algorithm, and the forward and backward probabilities $A_j^k = \ln(\alpha_j^k)$ and $B_j^k = \ln(\beta_j^k)$ of equations (8) and (9) may be modified based on the merged trellis structure. In the trellis shown in FIG. 2(a) for N=2, for example, the value of the forward probability $A_2^k$ in equation (8) for state 2 at time k is computed as in equation (11):

$$A_2^k = \max^*(A_0^{k-2} + \tilde{\Gamma}_{0,2}^k, A_2^{k-2} + \tilde{\Gamma}_{2,2}^k, A_4^{k-2} + \tilde{\Gamma}_{4,2}^k, A_6^{k-2} + \tilde{\Gamma}_{6,2}^k), \quad (11)$$

When evaluating the max*( ) operation with greater than two values for comparison, such as in equation (11), the operation is carried out iteratively over pairs values.

The value $\tilde{\Gamma}_{i,j}^k$ is defined as the combined branch metric associated with the transition from state i at time k–2 to state j at time k in the forward direction of the merged trellis (e.g., in FIG. 2 paths traversed in state transitions occurring from left to right). The combined branch metric may be cumulatively computed in the trellis in a manner well known in the art. For example, referring to FIG. 1, the path of the trellis of FIG. 1 that transitions from state 2 at time k–2 to state 0 at time k is state 2 at time k–2 through state 4 at time k–1 to state 0 at time k. For the merged trellis of FIG. 2(a), the branch metric $\tilde{\Gamma}_{2,0}^k$ for the transition from state 2 at time k–2 to state 0 at time k, is the combination of the branch metrics $\Gamma_{2,4}^{k-1}$ and $\Gamma_{4,0}^k$ for the transitions from state 2 at time k–2 to state 4 at time k–1; and from state 4 at time k–1 to state 0 at time k, respectively. Thus, the combined branch metric $\tilde{\Gamma}_{2,0}^k$ from state 2 at time k–2 to state 0 at time k is $\tilde{\Gamma}_{2,0}^k = \Gamma_{2,4}^{k-1} + \Gamma_{4,0}^k$.

Extending this approach of the N=2 case, the forward recursion equation is then generalized to the N=3 case of FIG. 2(b) as in equation (12):

$$A_j^k = \max^*_{i=0, 1, \ldots, 7}(A_i^{k-3} + \tilde{\Gamma}_{i,j}^k) \text{ for } j=0, 1, \ldots, M-1, \quad (12)$$

where the combined branch metric is obtained by adding three individual branch metrics from time k–3 to time k, and M is the number of states.

A similar modification employing the techniques described above may be made to the relation of, for example, equation (9) for calculating the backward probability $B_j^{k-N}$. However, the backward probabilities are updated based on traversing the merged trellis in an opposite direction to that traversed when calculating forward probabilities. Consequently, the cumulative branch metric values for transitions are derived in the opposite direction to that of cumulative branch metric values for transitions in the forward direction.

The block processing technique may be extended to a larger N by combining trellises from time k–N to time k. This technique for generating branch metrics allows for a reduction in the memory space required to store the forward and backward probabilities (state metrics) $A_j^k$ and $B_i^{k-N}$ by N.

When implemented, a MAP algorithm employing a merged trellis structure updates the state metrics to compute $\alpha_j^k$ and $\beta_i^{k-N}$ (or their log values $A_j^k$ and $B_i^{k-N}$ for the Log MAP algorithm) based on 1) the current values for the state metrics $\alpha_i^{k-N}$ and $\beta_j^k$ for all i and j (all states in the set S) and 2) the block of N signal input samples $[y_k, y_{k+1}, \ldots, y_{k+N-1}]$. The update operation occurs for each time k=0, N, 2N, ... L–N+1 and occurs at a rate of 1/N times the rate of processing steps of the prior art trellis of, for example, FIG. 1 (i.e., with a rate of f/N). Thus, the read/write operation for an implementation transfers words of length N for each update operation, but the frequency (and hence, number) of update operations is reduced by a factor of N. Data transfer operations consume relatively high power, and so reducing the number of data transfer operations provides a relative reduction in overall power consumption.

FIG. 3 shows an exemplary implementation of memory and memory access for a MAP processor operating in accordance with an exemplary embodiment of the present invention. In FIG. 3, MAP processor 301 accesses memory 302 in read/write operations during the forward and backward probability update process. As shown in FIG. 3, memory 302 is divided into blocks $[y_k, y_{k+1}, \ldots, y_{k+N-1}]$, k=0, N, 2N, ..., L–N+1, of the input sample sequence $[y_0, y_1, \ldots, y_L]$.

FIG. 4 shows an exemplary method of MAP detection by MAP processor 301 including updating forward and backward probabilities in accordance with an exemplary embodiment of the present invention. At step 401, the method retrieves the first block of samples beginning at time k=0 along with the corresponding forward probabilities. At step 402 the forward probabilities are updated, such as the update for forward probability $A_2^k$ for the Log MAP algorithm given in equation (11) for the N=2 case. At step 403, a test determines if the last block of samples (i.e., at time k=L–N+1) has been processed, and if not, the method advances to step 404 to point to the next block of samples in memory. The method then returns to step 401 from step 404 to process the next block.

If the test of step 403 determines that all forward probabilities have been updated, the methods advances to step 407 to begin the process of updating the backward probabilities. At step 407, the method retrieves the first block of samples beginning at time k=L–N+1 along with the corresponding backward probabilities. At step 408 the backward probabilities are updated. At step 409, a test determines if the last block of samples has been processed, and if not, the method advances to step 412 to point to the next block of samples in memory. The method then returns to step 407 from step 412 to process the next block.

If the test of step 409 determines that the last block for the current time k has been processed and, so all backward probabilities for each time k have been updated, then the method advances to step 413. At step 413 the MAP algorithm computes the log-likelihoods in accordance with MAP processing algorithms well known in the art.

Table 1 shows the number of operations per user data for different given values of N in an 8-state trellis, where N=1 is the conventional MAP algorithm of the prior art such as shown in FIG. 1.

TABLE 1

| Operation | N = 1 | N = 2 | N = 3 |
|---|---|---|---|
| addition | 8 · 2 = 16 | 8 · 8/2 = 32 | 8 · 24/3 = 64 |
| max* calculation | 8 | 8 · 3/2 = 12 | 8 · 7/3 = 56/3 |

In Table 1, "·" represents multiplication. As shown in Table 1, computational complexity increases with increasing N. However, for typical processing implementations, the power consumption associated with data transfer (read/write) operations is significantly greater than power consumption associated with computational operations.

While the exemplary embodiments of the present invention have been described with respect to methods implemented within a detector, as would be apparent to one skilled in the art, various functions may be implemented in the digital domain as processing steps in a software program, by digital logic, or in combination of both software and hardware. Such software may be employed in, for example, a digital signal processor, micro-controller or general-purpose computer. Such hardware and software may be embodied within circuits implemented in an integrated circuit.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, stored in a storage medium and loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method of processing encoded data comprising one or more blocks of samples the method comprising the steps of:
   (a) receiving the encoded data;
   (b) retrieving a first block of samples from the encoded data and a corresponding set of forward probabilities, wherein the block of samples correspond to states of a merged trellis, wherein the merged trellis provides combined probabilities of transition from one or more states at k−N, N an integer greater than 1, to current states at time k as the set of forward probabilities; and (c) updating the set of forward probabilities of the merged trellis for the current state at time k, based on the block of samples and the corresponding set of forward probabilities;

wherein updating the forward probability for a state in step (c) comprises the step of selecting the maximum combined probability for transitions to the current state, given by:

$$A_j^k = \max^*_{i=0, 1, \ldots, M-1} \gamma(A_i^{k-3} + \tilde{\Gamma}_{i,j}^k) \text{ for } j=0, 1, \ldots,$$

where $\tilde{\Gamma}_{i,j}^k$ is the combined probability obtained by adding N individual branch metrics from time k−N to time k in an original trellis, and M is the number of states;

(d) using the maximum combined probability $A_j^k$ to calculate one or more log-likelihood values in a maximum a posteriori (MAP) processor for one or more blocks of samples corresponding to the data; and (e) detecting or decoding the encoded data using the one or more log-likelihood values.

2. The invention as recited in claim 1, further comprising the steps of:

(f) retrieving a second block of samples and a corresponding set of backward probabilities, wherein the samples correspond to states of the merged trellis, wherein the merged trellis provides cumulative probabilities of transition from one or more states at time k+N to current states at time k as the set of backward probabilities; and (g) updating the set of backward probabilities of the merged trellis for the current state at time k, based on the second block of samples and the corresponding set of backward probabilities.

3. The invention as recited in claim 2, further comprising the steps of computing log-likelihood values from the updated forward and backward probabilities and generating a data sequence for one or more blocks of samples corresponding to the log-likelihood values.

4. The invention as recited in claim 1, further comprising the step of storing in or reading from a memory each block of sample values for each update in step (a).

5. The invention as recited in claim 1, wherein the method is employed during a step of either maximum a posteriori (MAP) detection or MAP decoding of received samples.

6. The invention as recited in claim 1, wherein the method is implemented by a processor in an integrated circuit.

7. Apparatus for processing encoded data comprising one or more blocks of samples, the apparatus comprising:

a maximum a posteriori (MAP) processor comprising:

a first module retrieving a first block of samples from the encoded data and a corresponding set of forward probabilities, wherein the block of samples correspond to states of a merged trellis, wherein the merged trellis provides combined probabilities of transition from one or more states at k−N, N an integer greater than 1, to current states at time k as the set of forward probabilities; and a second module updating the set of forward probabilities of the merged trellis for the current state at time k, based on the block of samples and the corresponding set of forward probabilities;

wherein the second module updates the forward probability for a state in step (b) by selecting the maximum combined probability for transitions to the current state, given by:

$$A_j^k = \max^*_{i=0, 1, \ldots, M-1} \gamma(A_i^{k-N} + \tilde{\Gamma}_{i,j}^k) \text{ for } j=0, 1, \ldots,$$

where $\tilde{\Gamma}_{i,j}^k$ is the combined probability obtained by adding N individual branch metrics from time k−N to time k in an original trellis, and M is the number of states;

wherein the MAP processor is adapted to:

use the maximum combined probability $A_j^k$ to calculate one or more log-likelihood values for one or more blocks of samples corresponding to the data; and detect or decode the encoded data using the one or more log-likelihood values.

8. The invention as recited in claim 7, wherein the MAP processor further comprises:

a third module retrieving a second block of samples and a corresponding set of backward probabilities, wherein the samples correspond to states of the merged trellis, wherein the merged trellis provides cumulative probabilities of transition from one or more states at time k+N to current states at time k as the set of backward probabilities; and a fourth module updating the set of backward probabilities of the merged trellis for the current state at time k, based on the second block of samples and the corresponding set of backward probabilities.

9. The invention as recited in claim 8, wherein the MAP processor is configured to 1) compute log-likelihood values from the updated forward and backward probabilities and 2) generate a data sequence for one or more blocks of samples corresponding to the log-likelihood values.

10. The invention as recited in claim 7, further comprising a memory, wherein the MAP processor stores in or reads from the memory each block of sample values for each update.

11. The invention as recited in claim 7, wherein the apparatus is a circuit embodied in an integrated circuit.

12. A machine-readable medium having stored thereon a plurality of machine-readable instructions, the plurality of instructions including instructions which, when executed by a processor, cause the processor to implement a method for processing encoded data comprising one or more blocks of samples, the method comprising the steps of:

(a) receiving the encoded data;

(b) retrieving a first block of samples from the encoded data and a corresponding set of forward probabilities, wherein the block of samples correspond to states of a merged trellis, wherein the merged trellis provides combined probabilities of transition from one or more states at k−N, N an integer greater than 1, to current states at time k as the set of forward probabilities; and (c) updating the set of forward probabilities of the merged trellis for the current state at time k, based on the block of samples and the corresponding set of forward probabilities;

wherein updating the forward probability for a state in step (c) comprises the step of selecting the maximum combined probability for transitions to the current state, given by:

$$A_j^k = \max^*_{i=0, 1, \ldots, M-1} \gamma(A_i^{k-N} + \tilde{\Gamma}_{i,j}^k) \text{ for } j=0, 1, \ldots,$$

where $\tilde{\Gamma}_{i,j}^k$ is the combined probability obtained by adding N individual branch metrics from time k−N to time k in an original trellis, and M is the number of states;

(d) using the maximum combined probability $A_j^k$ to calculate one or more log-likelihood values in a maximum a posteriori (MAP) processor for one or more blocks of samples corresponding to the data; and (e) detecting or decoding the encoded data using the one or more log-likelihood values.

13. The invention as recited in claim 12, wherein the method further comprises the steps of:

(f) retrieving a second block of samples and a corresponding set of backward probabilities, wherein the samples correspond to states of the merged trellis, wherein the merged trellis provides cumulative probabilities of transition from one or more states at time k+N to current states at time k as the set of backward probabilities; and (g) updating the set of backward probabilities of the merged trellis for the current state at time k, based on the second block of samples and the corresponding set of backward probabilities.

* * * * *

UNITED STATES PATENT AND TRADEMARK OFFICE
CERTIFICATE OF CORRECTION

PATENT NO. : 7,353,450 B2
APPLICATION NO. : 10/054687
DATED : April 1, 2008
INVENTOR(S) : Thaddeus J. Gabara et al.

It is certified that error appears in the above-identified patent and that said Letters Patent is hereby corrected as shown below:

In column 7, lines 10 to 13 replace, " $A_j^k = \max^*_{i=0,1,...,7} ( A_i^{k-3} + \tilde{\Gamma}_{i,j}^k )$ for j=0,1,..., M-1," with -- $A_j^k = \max^*_{i=0,1,...,7} ( A_i^{k-N} + \tilde{\Gamma}_{i,j}^k )$ for j=0,1,..., M-1,--.

Signed and Sealed this

Seventh Day of April, 2009

JOHN DOLL
*Acting Director of the United States Patent and Trademark Office*